United States Patent
Huang et al.

(10) Patent No.: US 12,143,118 B2
(45) Date of Patent: Nov. 12, 2024

(54) FRONT-END SAMPLING CIRCUIT AND METHOD FOR SAMPLING SIGNAL

(71) Applicant: REALTEK SEMICONDUCTOR CORPORATION, Hsinchu (TW)

(72) Inventors: Shih-Hsiung Huang, Hsinchu (TW); Yen-Ting Wu, Hsinchu (TW); Wei-Cian Hong, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 179 days.

(21) Appl. No.: 17/864,471

(22) Filed: Jul. 14, 2022

(65) Prior Publication Data

US 2023/0140965 A1    May 11, 2023

(30) Foreign Application Priority Data

Nov. 5, 2021   (TW) ................... 110141356

(51) Int. Cl.
*H03M 1/12*    (2006.01)

(52) U.S. Cl.
CPC ....... *H03M 1/1245* (2013.01); *H03M 1/1215* (2013.01)

(58) Field of Classification Search
CPC ................... H03M 1/1215; H03M 1/1245
USPC ................................ 341/122, 155
See application file for complete search history.

(56) References Cited

U.S. PATENT DOCUMENTS

| | | |
|---|---|---|
| 5,410,269 A | 4/1995 | Ohie |
| 7,332,941 B2 | 2/2008 | Ishii |
| 2013/0076429 A1* | 3/2013 | Taddiken ............. H03K 17/693 327/419 |

OTHER PUBLICATIONS

OA letter of a counterpart TW application (appl. No. 110141356) mailed on Jul. 18, 2022. Summary of the TW OA letter in regard to the TW counterpart application: Claims 1-2, 6, and 10 are rejected as allegedly being anticipated by cited reference 1 (U.S. Pat. No. 7,332,941 B2). Claims 1-2, 6-8, and 10 are rejected as allegedly being anticipated by cited reference 2 (U.S. Pat. No. 5,410,269 A). Claim 9 is rejected as allegedly being unclear.

* cited by examiner

*Primary Examiner* — Peguy Jean Pierre
(74) *Attorney, Agent, or Firm* — WPAT, P.C (57) ABSTRACT

A front-end sampling circuit includes a global switch, a local switch, and an auxiliary switch. The global switch is configured to be selectively turned on according to a first control signal, in order to transmit an input signal. The local switch is configured to be selectively turned on according to a second control signal, in order to transmit the input signal from the global switch to a node, wherein a storage circuit is coupled to the node to store the input signal. The auxiliary switch is configured to be selectively turned on according to a third control signal, in order to transmit the input signal to the node, in which a turn-off time point of the auxiliary switch is set to be the same or earlier than a turn-off time point of the global switch.

20 Claims, 7 Drawing Sheets

FRONT-END SAMPLING CIRCUIT AND METHOD FOR SAMPLING SIGNAL

BACKGROUND OF THE INVENTION

1. Field of the Invention

The present disclosure relates to a front-end sampling circuit applied to an analog to digital converter, especially to a front-end sampling circuit that employs additional path(s) to increase the speed of tracking an input signal and a signal sampling method thereof.

2. Description of Related Art

An analog to digital converter is commonly used in various electronic devices to convert analog signals into corresponding digital signals for subsequent signal processing. With the increasing operating speed, the available operational period of the analog to digital converter to convert signals is shorter and shorter. For example, a sampling circuit is required to sample input signals within a limited sampling period. When the frequency of the input signal is very high, the input signal will produce a certain amount of voltage difference in a very short time. In this case, the sampling circuit in the existing approach requires a long processing time to obtain the corresponding signal value. If the sampling circuit is unable to track the input signal during the limited sampling period, the sampled signal value may be distorted to be insufficient to recover the input signal, which results in a lower resolution of the analog to digital converter.

SUMMARY OF THE INVENTION

In some aspects, an object of the present disclosure may be, but not limited to, to provide a front-end sampling circuit and a signal sampling method applied to a time interleaved analog to digital converter.

In some aspects of the present disclosure, a front-end sampling circuit includes a global switch, a local switch, and an auxiliary switch. The global switch is configured to be selectively turned on according to a first control signal, in order to transmit an input signal. The local switch is configured to be selectively turned on according to a second control signal, in order to transmit the input signal from the global switch to a node, wherein a storage circuit is coupled to the node to store the input signal. The auxiliary switch is configured to be selectively turned on according to a third control signal, in order to transmit the input signal to the node, in which a turn-off time point of the auxiliary switch is set to be the same or earlier than a turn-off time point of the global switch.

In some aspects of the present disclosure, a signal sampling method includes the following operations: selectively turning on a global switch according to a first control signal, in order to transmit an input signal; selectively turning on a local switch according to a second control signal, in order to transmit the input signal from the global switch to a node, wherein a storage circuit is coupled to the node to store the input signal; and selectively turning on an auxiliary switch according to a third control signal, in order to transmit the input signal to the node, in which a turn-off time point of the auxiliary switch is set to be earlier than or the same as a turn-off time point of the global switch.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may be a system formed with at least one circuit, and the term "circuit" may indicate an object, which is formed with one or more transistors and/or one or more active/passive elements based on a specific arrangement, for processing signals.

As used herein, "substantially", "close to" or "equal to" shall generally mean within 20 percent, preferably within 10 percent, and more preferably within 5 percent of a given value or range. Numerical quantities given herein are approximate, meaning that the term "substantially", "close to" or "equal to" can be inferred if not expressly stated.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
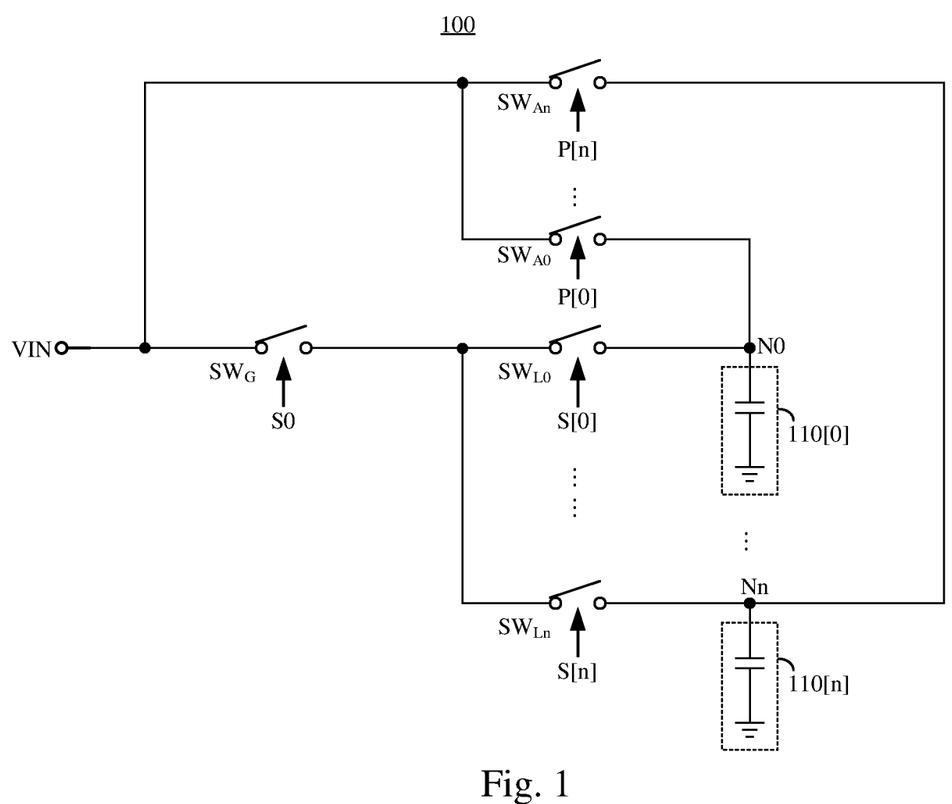
FIG. 1 shows a schematic diagram of a front-end sampling circuit according to some embodiments of the present disclosure.

FIG. 1 shows a schematic diagram of a front-end sampling circuit 100 according to some embodiments of the present disclosure. In some embodiments, the front-end sampling circuit 100 may be, but not limited to, applied to a time interleaved analog to digital converter, in order to configure channels of the time interleaved analog to digital converter to alternately sample an input signal VIN.

The front-end sampling circuit 100 includes a global switch $SW_G$, local switches $SW_{L0}$-$SW_{Ln}$, auxiliary switches $SW_{A0}$-$SW_{An}$, and storage circuits 110[0]-110[n] (several of which are omitted in the figure). In some embodiments, the storage circuits 110[0]-110[n] may be sample and hold circuits in the channels of the time interleaved analog to digital converter, in which n may be a positive integer higher than or equal to 1. For example, each of the storage circuits 110[0]-110[n] may be, but not limited to, implemented with a capacitor array circuit or a capacitive digital to analog converter circuit.

The global switch $SW_G$ is configured to be selectively turned on according to a control signal S0, in order to transmit the input signal VIN. Each of the local switches $SW_{L0}$-$SW_{Ln}$ is configured to be turned on according to a corresponding one of control signals S[0]-S[n], in order to transmit the input signal VIN from the global switch $SW_G$ to a corresponding one of nodes N0-Nn (several of which are omitted in the figure). The storage circuits 110[0]-110[n] are coupled to the nodes N0-Nn, in order to store the input signal VIN for subsequent signal conversion. In greater detail, taking the local switch $SW_{L0}$ and the storage circuit 110[0] as an example, a first terminal of the global switch $SW_G$ receives the input signal VIN, a second terminal of the global switch $SW_G$ is coupled to the node N0 via the local switch $SW_{L0}$, and a control terminal of the global switch $SW_G$ receives the control signal S0. The local switch $SW_{L0}$ is turned on according to the control signal S[0], in order to transmit the input signal VIN from the global switch $SW_G$ to the node N0. In other words, when the global switch $SW_G$ and the local switch $SW_{L0}$ are all turned on, the input signal VIN can be transmitted to the node N0, such that the storage circuit 110[0] stores the input signal VIN. With this analogy, the corresponding relation among the remaining local switch $SW_{L1}$-$SW_{Ln}$, the control signals S[1]-S[n], the storage circuits 110[1]-110[n], and the nodes N1-Nn can be understood. With the global switch $SW_G$, it is able to cut off the connection between the storage circuits 110[0]-110[n] and the input signal VIN during an interval when the input signal VIN is not sampled, in order to reduce impacts from timing skews of between the control signals S[1]-S[n].

Each of the auxiliary switches $SW_{A0}$-$SW_{An}$ is turned on according to a corresponding one of control signals P[0]-P[n], in order to transmit the input signal VIN to a corresponding one of the nodes N0-Nn. For example, the auxiliary switch $SW_{A0}$ is turned on according to the control signal P[0], in order to transmit the input signal VIN to the node N0. With this analogy, the corresponding relation among the remaining auxiliary switches $SW_{A1}$-$SW_{An}$, the control signals P[1]-P[n], and the nodes N1-Nn.

In different embodiments, a turn-on time of each of the auxiliary switches $SW_{A0}$-$SW_{An}$ may be set to be earlier than, the same as, or later than a turn-on time of the global switch $SW_G$, and a turn-off time of each of the auxiliary switches $SW_{A0}$-$SW_{An}$ may be set to be earlier than or the same as a turn-off time of the global switch $SW_G$. With such arrangement, each of the auxiliary switches $SW_{A0}$-$SW_{An}$ may provide an additional signal path to transmit the input signal VIN to the storage circuits 110[0]-110[n] during a progress of sampling the input signal VIN. As a result, the speed of the storage circuits 110[0]-110[n] on tracking the input signal VIN can be further improved, in order to sample the input signal VIN having high frequency.

In some embodiments, a specification requirement of each of the auxiliary switches $SW_{A0}$-$SW_{An}$ may be lower than a specification requirement of the global switch $SW_G$ or the local switches $SW_{L0}$-$SW_{Ln}$. In some embodiments, the specification requirement may include, but not limited to, a turn-on resistance value, a resistance value when the switch is turned on under different voltages, a clock feed through or a clock injection at the moment when the switch is turned on or off, linearity, and so on. For example, in order to improve the performance of the front-end sampling circuit 100, a switch circuit having higher performance may be employed to implement the global switch $SW_G$ or the local switches $SW_{L0}$-$SW_{Ln}$, such that those switches are able to have higher linearity or a more stable transconductance value. For example, each of the global switch $SW_G$ and the local switches $SW_{L0}$-$SW_{Ln}$ may be implemented with, but not limited to, a bootstrapped switch circuit. Correspondingly, the auxiliary switches $SW_{A0}$-$SW_{An}$ are configured to provide additional paths to improve the speed of tracking the input signal VIN without affecting the sampling operation, and thus each of the auxiliary switches $SW_{A0}$-$SW_{An}$ may be implemented with a simple switch circuit (which may be, but not limited thereto, a complementary transmission gate circuit). As a result, the circuit cost of the auxiliary switches $SW_{A0}$-$SW_{An}$ can be reduced. In other words, in some embodiments, the circuit area of each of the auxiliary switches $SW_{A0}$-$SW_{An}$ may be lower than the circuit area of each of the global switch $SW_G$ and the local switches $SW_{L0}$-$SW_{Ln}$.

Figure 2:
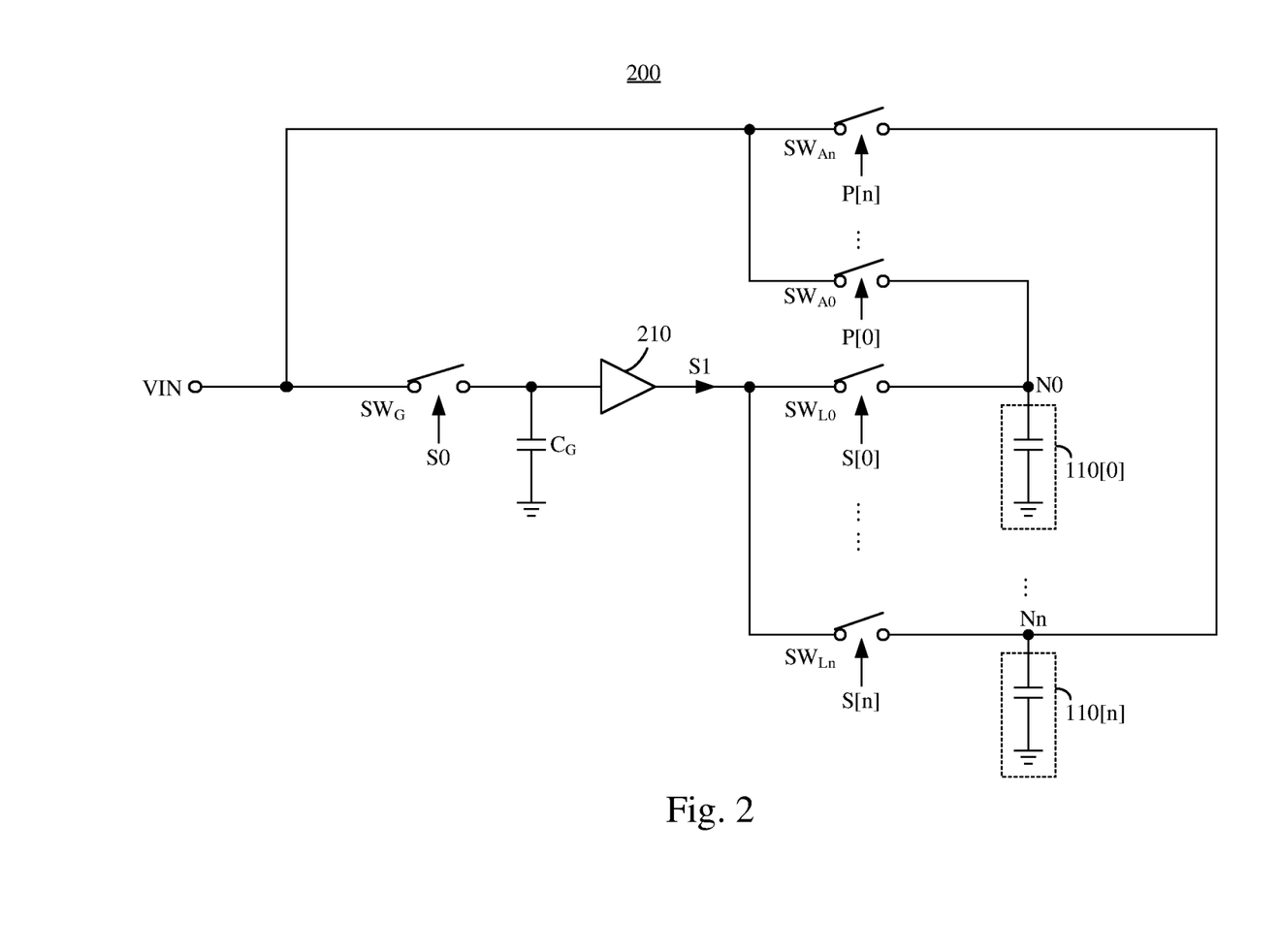
FIG. 2 shows a schematic diagram of a front-end sampling circuit according to some embodiments of the present disclosure.

FIG. 2 shows a schematic diagram of a front-end sampling circuit 200 according to some embodiments of the present disclosure. Compared with the front-end sampling circuit 100 in FIG. 1, in this embodiment, the front-end sampling circuit 200 further includes a capacitor $C_G$ and a buffer circuit 210.

The capacitor $C_G$ is coupled to the global switch $SW_G$, in order to receive the input signal VIN from the global switch $SW_G$ and store the input signal VIN to be a sampled signal S1. The buffer circuit 210 is coupled to the capacitor $C_G$, and is configured to transmit the sampled signal S1 to the local switches $SW_{L0}$-$SW_{Ln}$. In this embodiment, the local switches $SW_{L0}$-$SW_{Ln}$ are configured to transmit the sampled signal S1 to the nodes N0-Nn, and the storage circuits 110[0]-110[n] are further configured to store the sampled signal S1. For example, when the global switch $SW_G$ is turned on, the capacitor $C_G$ may store the input signal VIN to be the sampled signal S1. When the local switch $SW_{L0}$ is turned on, the sampled signal S1 may be transmitted to the node N0 via the local switch $SW_{L0}$. As a result, the storage circuit 110[0] may store the sampled signal S1.

With the buffer circuit 210, the driving ability can be further improved, in order to transmit the input signal VIN (which is equal to the sampled signal S1) to more storage circuits to increase the number of timer-leaved channels. Furthermore, compared with embodiments in FIG. 1, in this embodiment, the turn-off time of each of the auxiliary switches $SW_{A0}$-$SW_{An}$ may be set to be earlier than or the same as the turn-off time of the global switch $SW_G$. In other words, with the driving ability provided from the buffer circuit 210, the signal values stored in the storage circuits 110[0]-110[n] can be quickly corrected.

The number of circuits shown in FIG. 1 and FIG. 2 are for illustrative purposes only, and the present disclosure is not limited thereto. For example, the front-end sampling circuit 100 (or 200) may include more global switches and groups of local switches and groups of storage circuits corresponding to those global switches. Circuit arrangements of the front-end sampling circuit 100 (or 200) are given for illustrative purposes, and the present disclosure is not limited thereto. For example, in some other embodiments, each of the auxiliary switches $SW_{A0}$-$SW_{An}$ may be adjusted to be connected between the second terminal of the global switch $SW_G$ and a corresponding one of the nodes N0-Nn. For example, the auxiliary switch $SW_{A0}$ is coupled between the second terminal of the global switch $SW_G$ and the node N0. Various arrangements to utilize the auxiliary switches $SW_{A0}$-$SW_{An}$ to provide additional signal paths to increase the speed of tracking the input signal VIN are within the contemplated scope of the present disclosure.

Figure 3A:
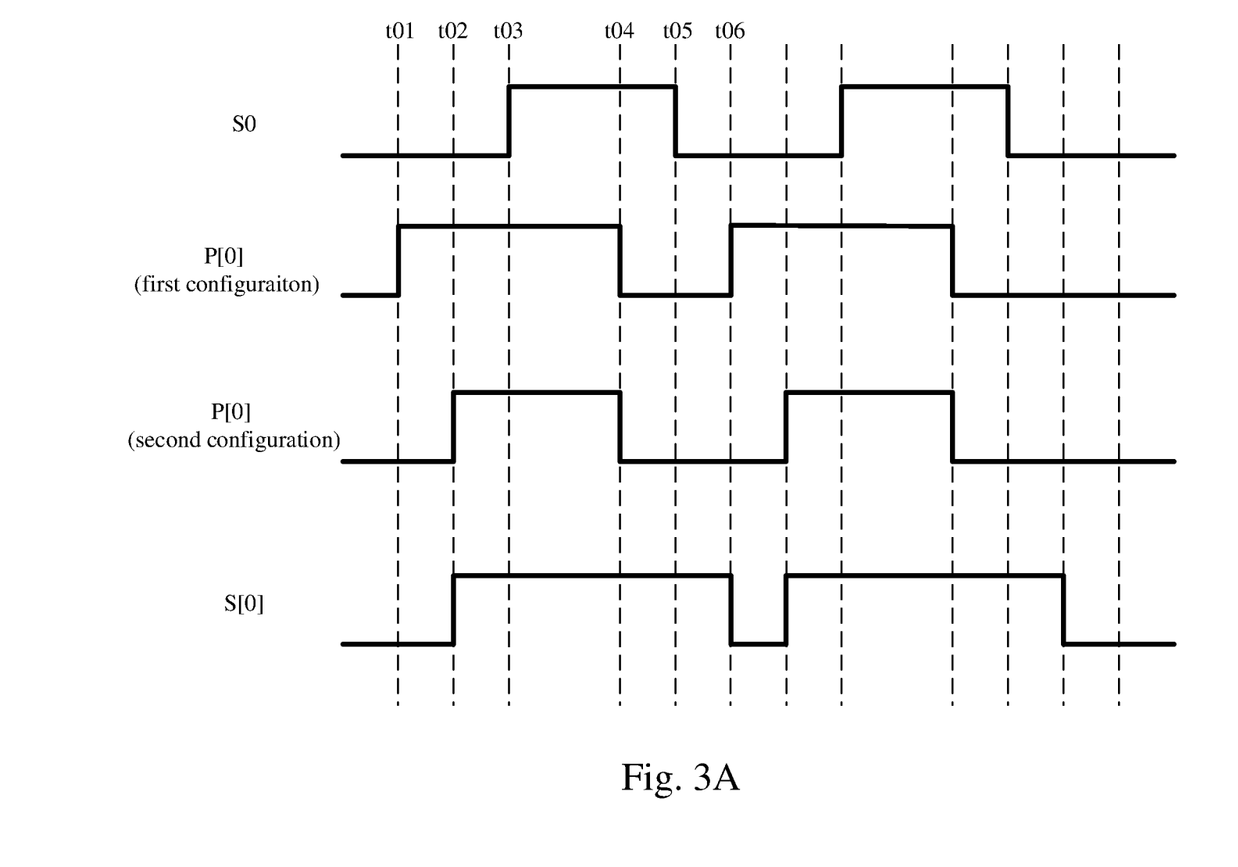
FIG. 3A shows a timing diagram of control signals in FIG. 1 or FIG. 2 according to some embodiments of the present disclosure.

FIG. 3A shows a timing diagram of control signals in FIG. 1 or FIG. 2 according to some embodiments of the present disclosure. In this embodiments, a turn-off time point (e.g., time point t04) of the auxiliary switch $SW_{A0}$ (which is controlled by the control signal P[0] in the first configuration and or the second configuration) is set to be earlier than a turn-off time point (e.g., time point t05) of the global switch $SW_G$ (which is controlled by the control signal S0), and a turn-on time point (e.g., time point t01 or t02) of the auxiliary switch $SW_{A0}$ is set to be earlier than a turn-on time point (e.g., time point t03) of the global switch $SW_G$.

For example, at the time point t04, the control signal P[0] is transited to a disabling level, in order to turn off the auxiliary switch $SW_{A0}$. In other words, a time point of the auxiliary switch $SW_{A0}$ started being turned off is the time point t04. Similarly, at the time point t05, the control signal S0 is transited to the disabling level, in order to turn off the global switch $SW_G$. In other words, a time point of the global switch $SW_G$ started being turned off (i.e., not turned on) is the time point t05, in which the time point t04 is earlier than the time point t05. Furthermore, at the time point t01 (see the control signal P[0] in the first configuration) or the time point t02 (see the control signal P[0] in the second configuration), the control signal P[0] is transited to an enabling level, in order to turn on the auxiliary switch $SW_{A0}$. A turn-on time point of the auxiliary switch $SW_{A0}$ started being turned on is the time point t01 (the control signal P[0] in the first configuration) or the time point t02 (the control signal P[0] in the second configuration). Similarly, at the time point t03, the control signal S0 is transited to the enabling level, in order to turn on the global switch $SW_G$. A turn-on time point of the global switch $SW_G$ started being turned on is the time point t03, in which the time points t01 and t02 are all earlier than the time point t03.

When the turn-off time point (e.g., time point t04) of the auxiliary switch $SW_{A0}$ is set to be earlier than the turn-off time point (e.g., time point t05) of the global switch $SW_G$, the turn-on time point (e.g., time point t02) of the local switch $SW_{L0}$ (which is controlled by the control signal S[0]) is set to be earlier than the turn-on time point (e.g., time point t03) of the global switch $SW_G$, and the turn-off time point (e.g., time point t06) of the local switch $SW_{L0}$ is later than the turn-off time point (e.g., time point t05) of the global switch $SW_G$. In greater detail, at the time point t02, the control signal S[0] is transited to the enabling level, in order to turn on the local switch $SW_{L0}$. In other words, the turn-on time point of the local switch $SW_{L0}$ started being turned on is the time point t02, in which the time point t02 is earlier than the time point t03 (i.e., the turn-on time point of the global switch $SW_G$). Similarly, at the time point t06, the control signal S[0] is transited to the disabling level, in order to turn off the local switch $SW_{L0}$. In other words, the turn-off time point of the local switch $SW_{L0}$ stating being turned off is the time point t06, in which the time point t06 is later than the time point t05 (i.e., the turn-off time point of the global switch $SW_G$).

Moreover, in this example, the turn-on time point of the auxiliary switch $SW_{A0}$ may be set to be earlier than or the same as the turn-on time point of the local switch $SW_{L0}$. For example, in the first configuration, the turn-on time point of the auxiliary switch $SW_{A0}$ is the time point t01, which is earlier than the turn-on time point of the local switch $SW_{L0}$ (e.g., time point t02). Alternatively, in the second configuration, the turn-on time point of the auxiliary switch $SW_{A0}$ is the time point t02, which is the same as the turn-on time point of the local switch $SW_{L0}$ (e.g., time point t02). With such arrangements, during the storage circuit 110[0] samples the input signal VIN, the auxiliary switch $SW_{A0}$ may be turned on to provide the addition path to couple the input signal VIN to the storage circuit 110[0], in order to improve the speed of the storage circuit 110[0] tracking the input signal VIN. In addition, as the turn-off time point of the auxiliary switch $SW_{A0}$ is earlier than the turn-off time point of the global switch $SW_G$, and thus the additional path does not affect the original sampling operations.

Figure 3B:
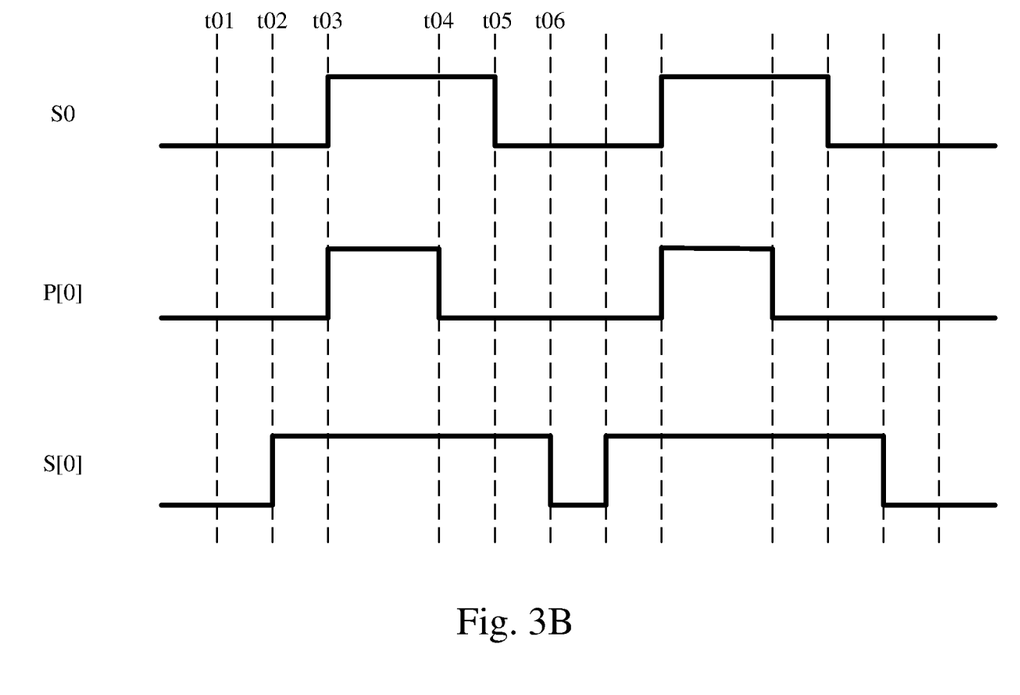
FIG. 3B shows a timing diagram of control signals in FIG. 1 or FIG. 2 according to some embodiments of the present disclosure.

FIG. 3B shows a timing diagram of control signals in FIG. 1 or FIG. 2 according to some embodiments of the present disclosure. Compared with FIG. 3A, in this embodiment, the turn-on time point (e.g., the time point t03) of the auxiliary switch $SW_{A0}$ (which is controlled by the control signal P[0]) is set to be the same as the turn-on time point (e.g., the time point t03) of the global switch $SW_G$. For example, the control signal P[0] and the control signal S0 are transited to the enabling level at the same time point t03, in order to respectively turn on the auxiliary switch $SW_{A0}$ and the global switch $SW_G$. The arrangements among the turn-off time point of the auxiliary switch $SW_{A0}$, the turn-off time point of the global switch $SW_G$, the turn-on time point of the local switch $SW_{L0}$, and the turn-off time point of the local switch $SW_{L0}$ are the same as those in FIG. 3A, and thus the repetitious descriptions are not further given.

Figure 4:
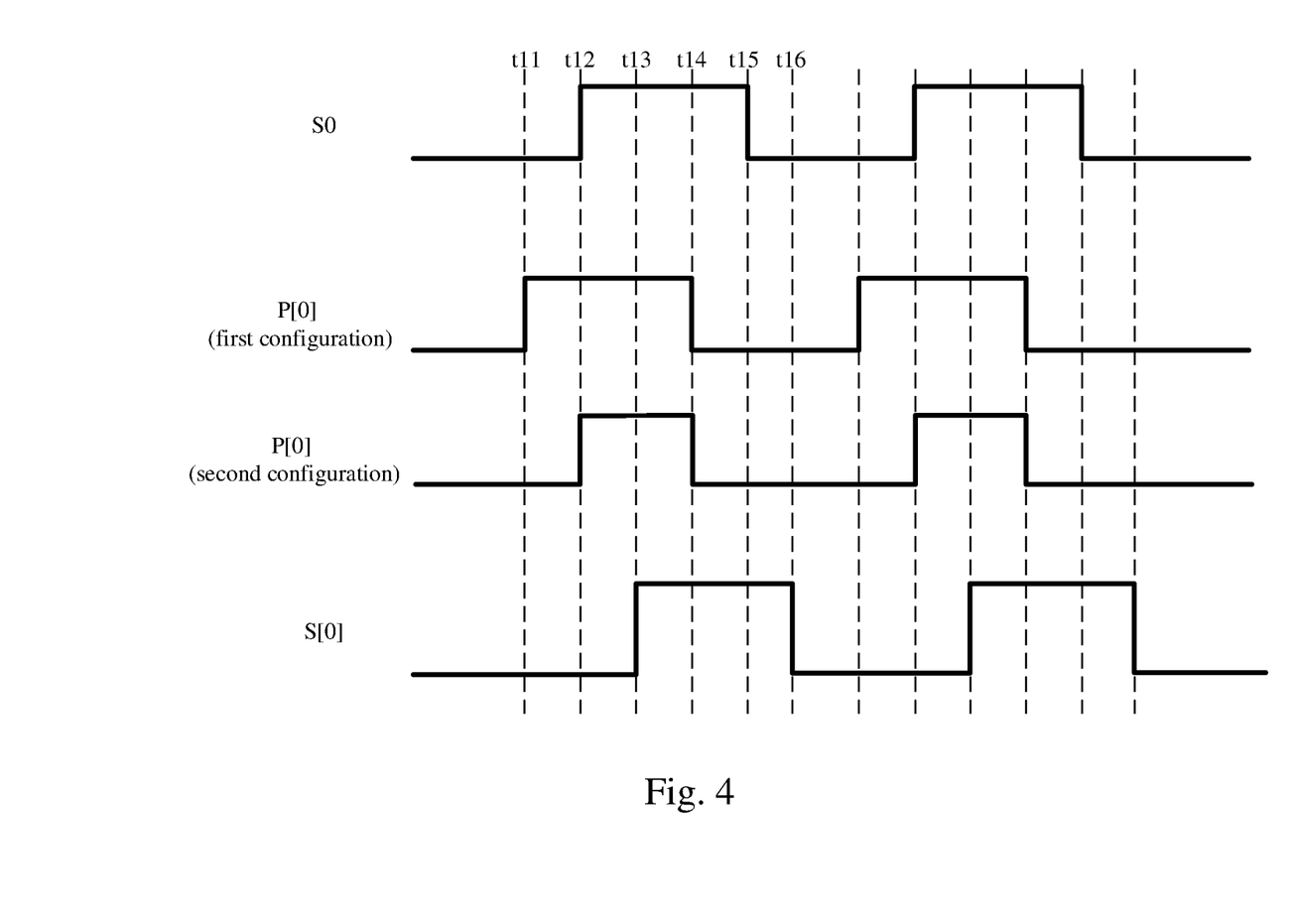
FIG. 4 shows a timing diagram of control signals in FIG. 1 or FIG. 2 according to some embodiments of the present disclosure.

FIG. 4 shows a timing diagram of control signals in FIG. 1 or FIG. 2 according to some embodiments of the present disclosure. In this embodiment, when the turn-off time point (e.g., time point t14) of the auxiliary switch $SW_{A0}$ (which is controlled by the control signal P[0] in the first or the second configuration) is set to be earlier than the turn-off time point (e.g., time point t15) of the global switch $SW_G$ (which is controlled by the control signal S0), the turn-on time point (e.g., time point t13) of the local switch $SW_{L0}$ (which is controlled by the control signal S[0]) is later than the turn-on time point (e.g., time point t12) of the global switch $SW_G$, and the turn-off time point (e.g., time point t16) of the local switch $SW_{L0}$ is later than the turn-off time point of the global switch $SW_G$.

In greater detail, at the time point t14, the control signal P[0] in the first or the second configuration is transited to the disabling level, in order to turn off the auxiliary switch $SW_{A0}$. In other words, the turn-off time point of the auxiliary switch $SW_{A0}$ started being turned off is the time point t14. At the time point t15, the control signal S0 is transited to the disabling level to turn off the global switch $SW_G$. In other words, the turn-off time point of the global switch $SW_G$ started being turned off is the time point t15, in which the time point t14 is earlier than the time point t15. Furthermore, at the time point t13, the control signal S[0] is transited to the enabling level, in order to turn on the local switch $SW_{L0}$. The turn-on time point of the local switch $SW_{L0}$ started being turned on is the time point t13. At the time point t12, the control signal S0 is transited to the enabling level, in order to turn on the global switch $SW_G$. The turn-on time point of the global switch $SW_G$ started turning on is the time point t12, in which the time point t13 is later than the time point t12. At the time point t16, the control signal S[0] is transited to the disabling level, in order to turn off the local switch $SW_{L0}$. The turn-off time point of the local switch $SW_{L0}$ started being turned off is the time point t16, in which the time point t16 is later than the time point t15 (i.e., the turn-off time point of the global switch $SW_G$).

Moreover, in this example, the turn-on time point of the auxiliary switch $SW_{A0}$ may be set to be earlier than or the same as the turn-on time point of the local switch $SW_{L0}$. For example, in the first configuration, the control signal P[0] is transited to the enabling level at the time point t11 to turn on the auxiliary switch $SW_{A0}$. The turn-on time point of the auxiliary switch $SW_{A0}$ is the time point t11, which is earlier than the turn-on time point of the local switch $SW_{L0}$ (e.g., time point t12). Alternatively, in the second configuration, the control signal P[0] is transited to the enabling level at the time point t12, in order to turn on the auxiliary switch $SW_{A0}$. The turn-on time point of the auxiliary switch $SW_{A0}$ is the time point t12, which is the same as the turn-on time point of the local switch $SW_{L0}$ (e.g., time point t12).

Figure 5:
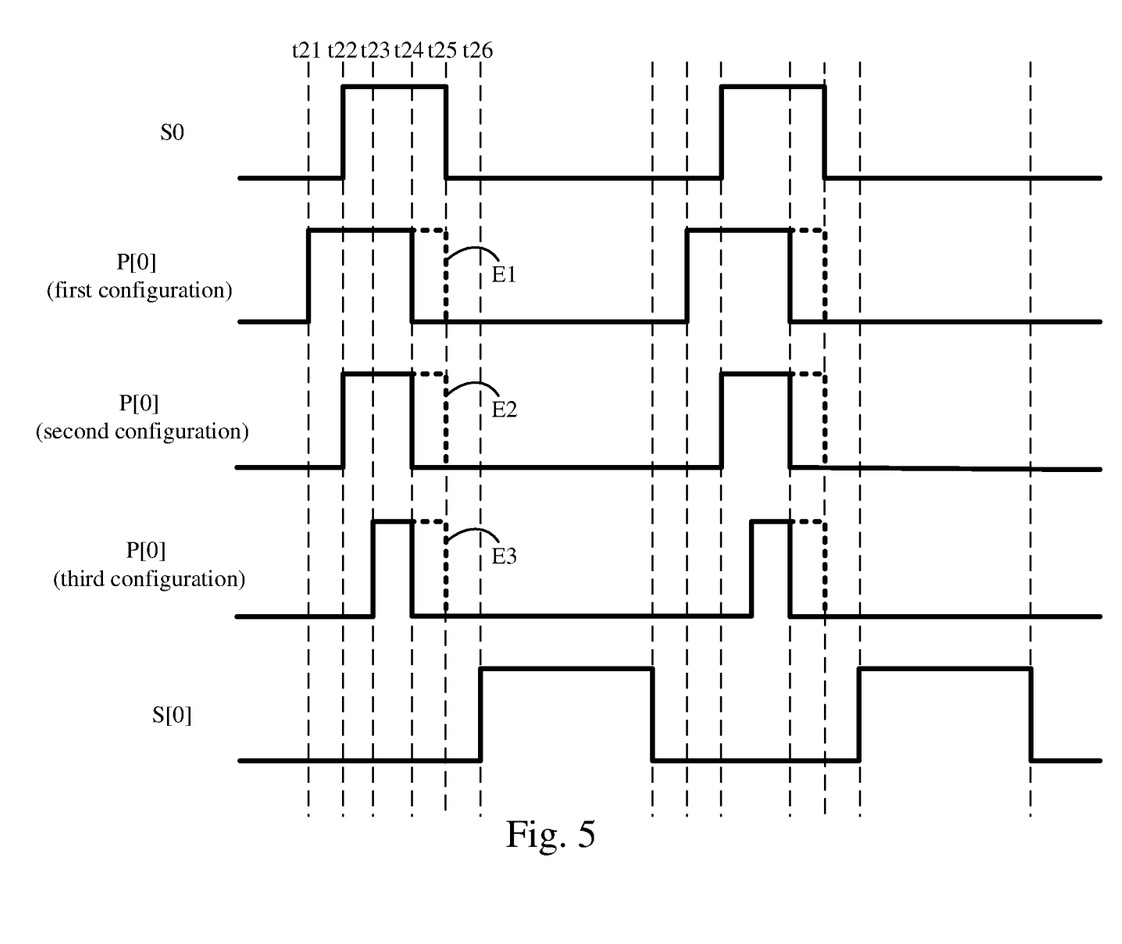
FIG. 5 shows a timing diagram of control signals in FIG. 2 according to some embodiments of the present disclosure.

FIG. 5 shows a timing diagram of control signals in FIG. 2 according to some embodiments of the present disclosure. In some embodiments, the timing configuration shown in FIG. 5 is suitable for the front-end sampling circuit 200 in FIG. 2. Different from the above embodiments, in FIG. 5, the turn-on time point of the auxiliary switch $SW_{A0}$ (which is controlled by the control signal P[0]) may be earlier than (i.e., the first configuration), the same as (i.e., the second configuration), or later than (i.e., the third configuration) the turn-on time point (e.g., time point t22) of the global switch $SW_G$ (which is controlled by the control signal S0), and the turn-off time point (e.g., time point t24 or t25) of the auxiliary switch $SW_{A0}$ may be earlier than or the same as the turn-off time point of the global switch $SW_G$ (e.g., time point t25).

In greater detail, at the time point t22, the control signal S0 is transited to the enabling level, in order to turn on the global switch $SW_G$. In other words, the turn-on time point of the global switch $SW_G$ started being turned on is t22. At the time point t25, the control signal S0 is transited to the disabling level, in order to turn off the global switch $SW_G$. In other words, the turn-off time point of the global switch $SW_G$ started being turned off is t25. In the first configuration, the control signal P[0] is transited to the enabling level at the time point t21 to turn on the auxiliary switch $SW_{A0}$, and the control signal P[0] is transited to the disabling time point at the time point t24 to turn off the auxiliary switch $SW_{A0}$. In the first configuration, the turn-on time point of the auxiliary switch $SW_{A0}$ started being turned on is the time point t21, which is earlier than the time point t22 (i.e., the turn-on time point of the global switch $SW_G$), and the turn-off time point of the auxiliary switch $SW_{A0}$ started being turned off is the time point t24, which is earlier than t25 (i.e., the turn-off time point of the global switch $SW_G$). Alternatively, in other examples, the control signal P[0] may be transited to the disabling level (e.g., falling edge E1) at the delayed time point t25 (shown with dotted lines) to turn off the auxiliary switch $SW_{A0}$. In other words, in the first configuration, the turn-off time point of the auxiliary switch $SW_{A0}$ started being turned off may be delayed to the time point t25, which is the same as the turn-off time point of the global switch $SW_G$.

Similarly, in the second configuration, the control signal P[0] is transited to the enabling level at the time point t22 to turn on the auxiliary switch $SW_{A0}$, and the control signal P[0] is transited to the disabling level at the time point t24 to turn off the auxiliary switch $SW_{A0}$. In the second configuration, e turn-on time point of the auxiliary switch $SW_{A0}$ started being turned on is the time point t22, which is the same as the turn-on time point of the global switch $SW_G$, and the turn-off time point of the auxiliary switch $SW_{A0}$ started being turned off may be the time point t24, which is earlier than the turn-off time point of the global switch $SW_G$. Alternatively, in other examples, the control signal P[0] may be transited to the disabling level (i.e., falling edge E2) at the delayed time point t25 (shown with dotted lines) to turn off the auxiliary switch $SW_{A0}$. In other words, in the second configuration, the turn-off time point of the auxiliary switch $SW_{A0}$ started being turned off may be delayed to the time point t25, which is the same as the turn-off time point of the global switch $SW_G$.

In the third configuration, the control signal P[0] is transited to the disabling level at the time point t23 to turn on the auxiliary switch $SW_{A0}$, and the control signal P[0] is transited to the disabling level at the time point t24 to turn off the auxiliary switch $SW_{A0}$. In the third configuration, the turn-on time point of the auxiliary switch $SW_{A0}$ of started being turned on is the time point t23, which is later than the turn-on time point of the global switch $SW_G$, and the turn-off time point of the auxiliary switch $SW_{A0}$ started being turned off may be the time point t24, which is earlier than the turn-off time point of the global switch $SW_G$. Alternatively, in other examples, the control signal P[0] may be transited to the disabling level (i.e., falling edge E3) at the delayed time point t25 (shown with dotted lines) to turn off the auxiliary switch $SW_{A0}$. In other words, in the third configuration, the turn-off time point of the auxiliary switch $SW_{A0}$ started being turned off may be delayed to the time point t25, which is the same as the turn-off time point of the global switch $SW_G$. As mentioned above, in embodiments of FIG. 2, with the buffer circuit 210, the signal value stored in the storage circuits 110[0]-110[n] can be corrected quickly. Therefore, in certain examples of FIG. 5, the auxiliary switch $SW_{A0}$ and the global switch $SW_G$ may be turned off at the same time point without affecting the original sampling operation.

Furthermore, in this embodiment, the turn-on time point (e.g., time point t26) of the local switch $SW_{L0}$ (which is controlled by the control signal S[0]) is later than the turn-off time point (e.g., time point t25) of the global switch $SW_G$. In greater detail, the control signal S0 is transited to the disabling level at the time point t26 to turn off the local switch $SW_{L0}$. In other words, the turn-off time point of the local switch $SW_{L0}$ started being turned off is t26, which is later than the turn-off time point of the global switch $SW_G$. With the above arrangement, it can prevent the local switch $SW_{L0}$ from affecting the progress of the capacitor $C_G$ storing the input signal VIN.

Timings shown in FIGS. 3A, 3B, 4, and 5 are given with examples of timings, for one sampling operation, of the control signal S[0] for controlling a local switch (e.g., the local switch $SW_{L0}$) and the control signal P[0] for controlling an auxiliary switch (e.g., the auxiliary switch $SW_{A0}$) in a channel of time interleaved channels. With this analogy, the corresponding relation between the control signals S[1]-S[n] and P[1]-P[n] corresponding to the remaining channels and the control signal S0 can be understood, and thus the repetitious descriptions are not further given.

Figure 6:
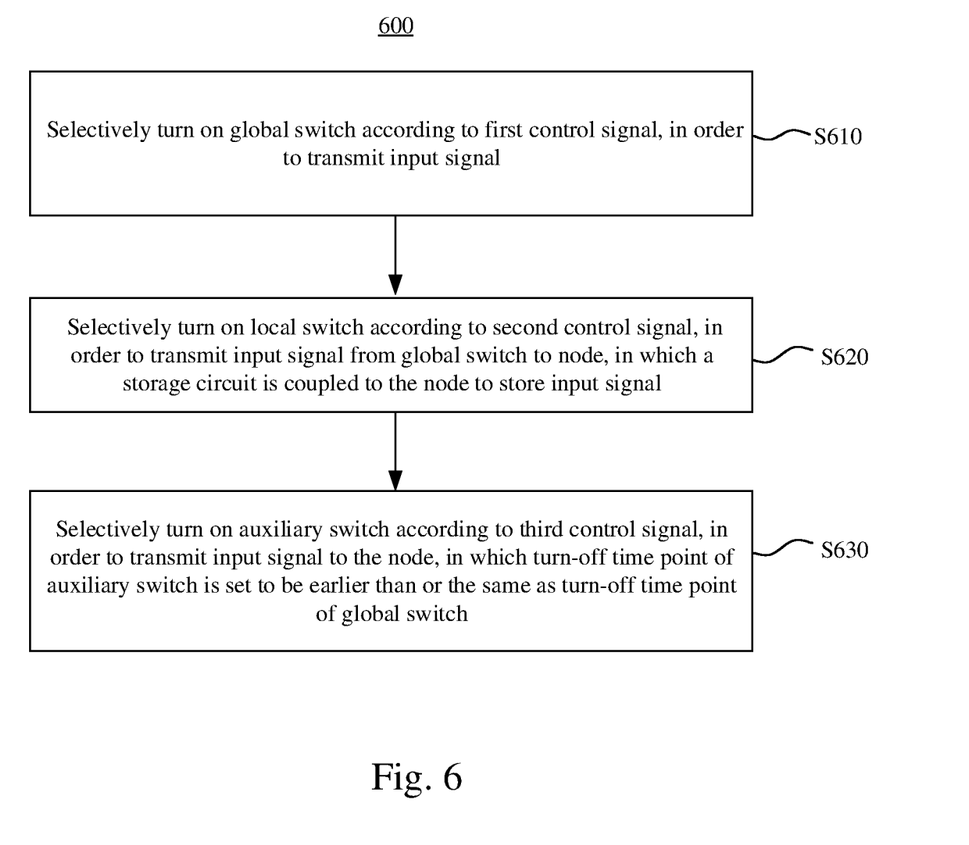
FIG. 6 shows a flow chart of a signal sampling method according to some embodiments of the present disclosure.

FIG. 6 shows a flow chart of a signal sampling method 600 according to some embodiments of the present disclosure. In operation S610, a global switch (e.g., the global switch $SW_G$) is selectively turned on according to a first control signal (e.g., the control signal S0), in order to transmit an input signal (e.g., the input signal VIN). In operation S620, a local switch (e.g., the local switch $SW_{L0}$) is selectively turned on according to a second control signal (e.g., the control signal S[0]), in order to transmit the input signal from the global switch to a node (e.g., the node NO), in which a storage circuit (e.g., the storage circuit 110[0]) is coupled to the node to store the input signal. In operation S630, an auxiliary switch (e.g., the auxiliary switch $SW_{A0}$) is selectively turned on according to a third control signal (e.g., the control signal P[0]), in order to transmit the input signal to the node, in which a turn-off time point of the auxiliary switch is set to be earlier than or the same as the turn-off time point of the global switch.

The above operations can be understood with reference to the above various embodiments, and thus the repetitious descriptions are not further given. The above description of the signal sampling method 600 includes exemplary operations, but the operations of the signal sampling method 600 are not necessarily performed in the order described above. Operations of the signal sampling method 600 can be added, replaced, changed order, and/or eliminated, or the operations of the signal sampling method 600 can be executed simultaneously or partially simultaneously as appropriate, in accordance with the spirit and scope of various embodiments of the present disclosure.

As described above, the front-end sampling circuit and the signal sampling method in some embodiments of the present disclosure may utilize switches having lower specification to provide addition signal paths for sampling. As a result, the speed of the storage circuit (e.g., sample and hold circuit) tracking the input signal can be improved, in order to increase the overall operating speed of the analog to digital converter.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:

1. A front-end sampling circuit, comprising:
a global switch configured to be selectively turned on according to a first control signal, in order to transmit an input signal;
a local switch configured to be selectively turned on according to a second control signal, in order to transmit the input signal from the global switch to a node, wherein a storage circuit is coupled to the node to store the input signal; and
an auxiliary switch configured to be selectively turned on according to a third control signal, in order to transmit the input signal to the node,
wherein a turn-off time point of the auxiliary switch is set to be the same or earlier than a turn-off time point of the global switch.

2. The front-end sampling circuit of claim 1, wherein a first terminal of the global switch and a first terminal of the auxiliary switch receive the input signal, and a second terminal of the global switch is coupled to the node via the local switch.

3. The front-end sampling circuit of claim 1, wherein a turn-on time point of the local switch is earlier than a turn-on time point of the global switch, and a turn-off time point of the local switch is later than the turn-off time point of the global switch.

4. The front-end sampling circuit of claim 3, wherein a turn-on time point of the auxiliary switch is earlier than or the same as the turn-on time point of the local switch.

5. The front-end sampling circuit of claim 1, wherein a turn-on time point of the local switch is later than a turn-on time point of the global switch, and a turn-off time point of the local switch is later than the turn-off time point of the global switch.

6. The front-end sampling circuit of claim 5, wherein a turn-on time point of the local switch is earlier than or the same as the turn-on time point of the global switch.

7. The front-end sampling circuit of claim 1, further comprising:
a capacitor coupled to the global switch to receive the input signal from the global switch and configured to store the input signal to be a sampled signal; and
a buffer circuit coupled to the capacitor and configured to transmit the sampled signal to the local switch,
wherein the local switch is further configured to transmit the sampled signal to the node, and the storage circuit is further configured to store the sampled signal.

8. The front-end sampling circuit of claim 7, wherein a turn-on time point of the auxiliary switch is earlier than, later than, or equal to a turn-on time point of the global switch, and a turn-on time point of the local switch is later than the turn-off time point of the global switch.

9. The front-end sampling circuit of claim 1, wherein a specification requirement of the auxiliary switch is lower than a specification requirement of the global switch or the local switch.

10. The front-end sampling circuit of claim 1, wherein the storage circuit is a sample and hold circuit in a channel of a time interleaved analog to digital converter.

11. A signal sampling method, comprising:
selectively turning on a global switch according to a first control signal, in order to transmit an input signal;
selectively turning on a local switch according to a second control signal, in order to transmit the input signal from the global switch to a node, wherein a storage circuit is coupled to the node to store the input signal; and
selectively turning on an auxiliary switch according to a third control signal, in order to transmit the input signal to the node, wherein a turn-off time point of the auxiliary switch is set to be earlier than or the same as a turn-off time point of the global switch.

12. The signal sampling method of claim 11, wherein a first terminal of the global switch and a first terminal of the auxiliary switch receive the input signal, and a second terminal of the global switch is coupled to the node via the local switch.

13. The signal sampling method of claim 11, wherein a turn-on time point of the local switch is earlier than a turn-on time point of the global switch, and a turn-off time point of the local switch is later than the turn-off time point of the global switch.

14. The signal sampling method of claim 13, wherein a turn-on time point of the auxiliary switch is earlier than or the same as the turn-on time point of the local switch.

15. The signal sampling method of claim 11, wherein a turn-on time point of the local switch is later than a turn-on time point of the global switch, and a turn-off time point of the local switch is later than the turn-off time point of the global switch.

16. The signal sampling method of claim 15, wherein a turn-on time point of the local switch is earlier than or the same as the turn-on time point of the global switch.

17. The signal sampling method of claim 11, further comprising:

receiving, by a capacitor, the input signal from the global switch, in order to store the input signal to be a sampled signal; and transmitting, by a buffer circuit, the sampled signal to the local switch, wherein the local switch is further configured to transmit the sampled signal to the node, and the storage circuit is further configured to store the sampled signal.

18. The signal sampling method of claim 17, wherein a turn-on time point of the local switch is later than the turn-off time point of the global switch.

19. The signal sampling method of claim 17, wherein a turn-on time point of the auxiliary switch is earlier than, later than, or equal to a turn-on time point of the global switch.

20. The signal sampling method of claim 11, wherein a specification requirement of the auxiliary switch is lower than a specification requirement of the global switch or the local switch.

* * * * *